(12) United States Patent
Duverger

(10) Patent No.: US 11,760,404 B2
(45) Date of Patent: Sep. 19, 2023

(54) ELECTRICAL DEVICE OF A MOTOR VEHICLE COMPONENT SUCH AS A STEERING WHEEL

(71) Applicant: Autoliv Development AB, Vargarda (SE)

(72) Inventor: Anthony Duverger, Montamise (FR)

(73) Assignee: Autoliv Development AB, Vårgårda (SE)

( * ) Notice: Subject to any disclaimer, the term of this patent is extended or adjusted under 35 U.S.C. 154(b) by 0 days.

(21) Appl. No.: 16/770,102

(22) PCT Filed: Dec. 5, 2018

(86) PCT No.: PCT/EP2018/083608
§ 371 (c)(1),
(2) Date: Jun. 5, 2020

(87) PCT Pub. No.: WO2019/110646
PCT Pub. Date: Jun. 13, 2019

(65) Prior Publication Data
US 2020/0385047 A1     Dec. 10, 2020

(30) Foreign Application Priority Data
Dec. 6, 2017   (FR) ...................................... 1761720

(51) Int. Cl.
*B62D 1/04*   (2006.01)
*B62D 1/06*   (2006.01)
*H05K 7/02*   (2006.01)

(52) U.S. Cl.
CPC .............. *B62D 1/046* (2013.01); *B62D 1/06* (2013.01); *H05K 7/02* (2013.01)

(58) Field of Classification Search
None
See application file for complete search history.

(56) References Cited

U.S. PATENT DOCUMENTS

| 8,095,270 B2 | 1/2012 | Bossler et al. |
| 8,463,352 B2 | 6/2013 | Song |

(Continued)

FOREIGN PATENT DOCUMENTS

| CN | 1353475 A | * | 6/2002 |
| DE | 10 2011 112134 A1 | | 3/2013 |
| EP | 2 511 154 A1 | | 10/2012 |

OTHER PUBLICATIONS

Preliminary Research Report of the French National Institute of Industrial Property Office for FR1761720 dated Aug. 27, 2018.

(Continued)

*Primary Examiner* — Vicky A Johnson
(74) *Attorney, Agent, or Firm* — Matthew D. Thayne; Thayne and Davis LLC

(57) ABSTRACT

An electrical device of a motor vehicle component (1) such as a steering wheel, comprising: a first electrical circuit part (5) of the electrical device, —a second electrical circuit part (6) of the electrical device; and an insert (2) which is at least partially visible by an occupant of the vehicle, said device being characterized in that: the device comprises a fastening clip (7) which is permanently in electrical contact with the first and second electrical circuit parts (5, 6), and the insert (2) comprises a zone (21) that interfaces with the fastening clip (7), the interface zone (21) being arranged, so as to compress contact zones (51, 61, 511, 513, 611, 613) of the first and second electrical circuit parts (5, 6), when the insert (2) is in a mounted position on the vehicle component (1), such that a contact resistance between the fastening clip (7) and the first and second electrical circuit parts (5, 6) is improved.

9 Claims, 4 Drawing Sheets

(56) References Cited

U.S. PATENT DOCUMENTS

| | | | |
|---|---|---|---|
| 8,656,804 B2 * | 2/2014 | Nagata | B60R 16/0215 |
| | | | 74/558 |
| 9,045,078 B2 | 6/2015 | Tovar et al. | |
| 9,139,217 B2 | 9/2015 | Bertrand et al. | |
| 2010/0251849 A1 * | 10/2010 | Kurata | B62D 1/046 |
| | | | 74/552 |
| 2011/0132136 A1 * | 6/2011 | Song | B60R 25/252 |
| | | | 74/552 |
| 2014/0026711 A1 | 1/2014 | Bertrand et al. | |
| 2014/0328077 A1 | 11/2014 | Tovar et al. | |

OTHER PUBLICATIONS

English machine translation of Preliminary Research Report of the French National Institute of Industrial Property Office for FR1761720 dated Aug. 27, 2018.
International Search Report of the International Searching Authority for PCT/EP2018/083608 dated Jan. 18, 2019.
English translation of International Search Report of the International Searching Authority for PCT/EP2018/083608 dated Jan. 18, 2019.

* cited by examiner

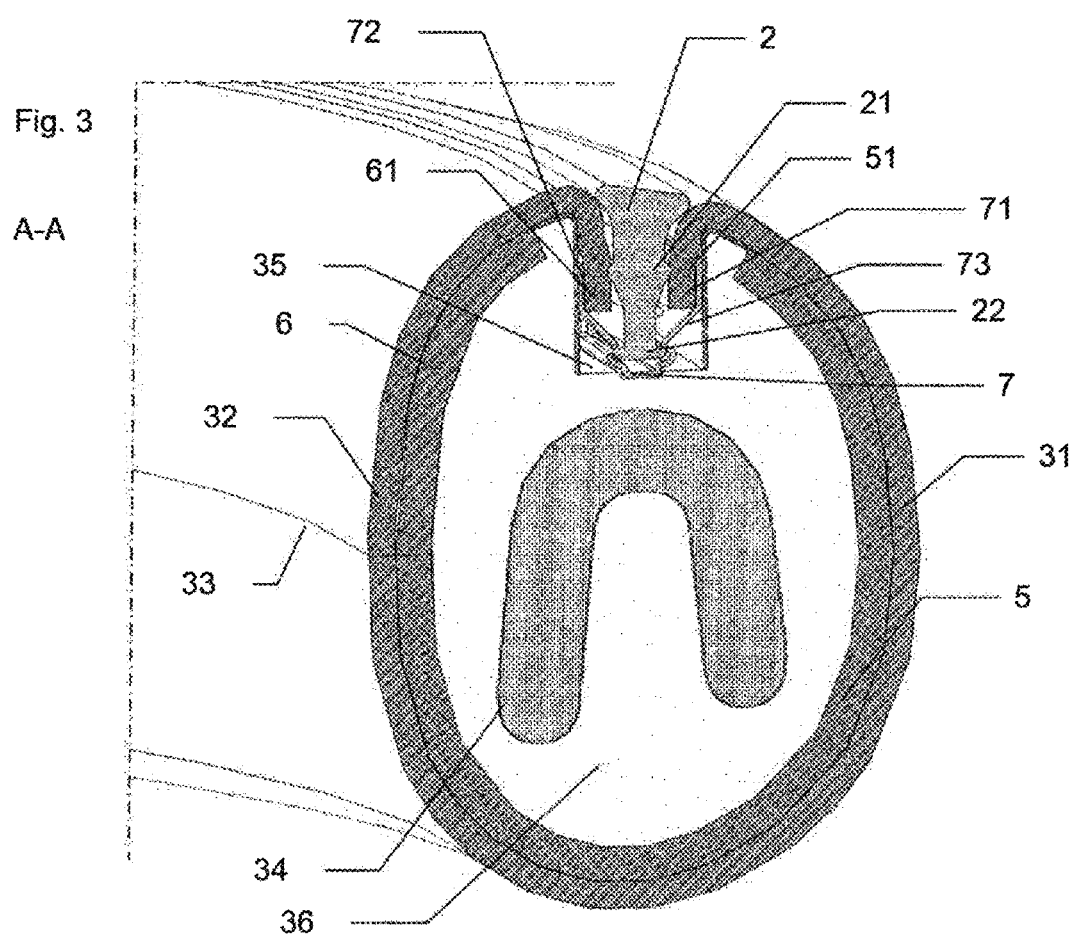

ELECTRICAL DEVICE OF A MOTOR VEHICLE COMPONENT SUCH AS A STEERING WHEEL

The present invention generally relates to electrical devices mounted on parts embedded in a motor vehicle passenger compartment. The invention may relate to heating, communication or presence detection devices that have flexible elements that have to be integrated at the surface or under the surfaces of parts that can be seen or touched by an occupant of the motor vehicle. These devices can be equally qualified as electrical devices or electronic devices.

Presence detection devices as described by document US2004267422 are known from the prior art. On the other hand, this system has the notable disadvantage that it is not compatible with all the shapes of parts on which it has to be embedded. In particular, it is not modular and may be difficult to connect or link to the electrical network of the vehicle in which it is embedded. Manufacturing is therefore made more complicated and the overall cost of the product is increased.

One aim of the present invention is to resolve the disadvantages of the aforementioned prior art document, and in particular, first of all, to provide an electrical device of a motor vehicle component that is easy to connect.

To this end, a first aspect of the invention relates to an electrical device of a motor vehicle component such as a steering wheel, comprising:
- a first electrical circuit part of the electrical device,
- a second electrical circuit part of the electrical device,
- an insert at least partially visible by an occupant of the vehicle, characterized:
in that the device comprises a fastening clip in permanent electrical contact with the first and second electrical circuit parts,
and in that the insert comprises a zone that interfaces with the fastening clip, the interface zone being arranged to, when the insert is in a mounted position on the vehicle component, compress at least one of the contact zones of the first and second electrical circuit parts so as to improve a contact resistance between the clip and at least one of the first part or second part of the electrical circuit.

The device and in particular the clip makes it possible to establish a rapid electrical connection that is safe and less expensive between the two electrical circuit parts. Thus, two simple elements that are easy to manufacture can be used instead of a complicated single electrical component that would have to adapt to the implantation of the insert, the insert being mounted on the rim for aesthetic or technical reasons when it is used as the electrode of a measurement system. It is possible to establish the electrical connection by positioning the electrical device between the insert and the clip or by positioning the clip between the electrical device and the insert. The interface zone can be a protrusion arranged to deform the clip when the insert is in mounted position. The modularity is increased, making good use of a clip that is held by the insert.

Advantageously, the first electrical circuit part is an electrode of a presence sensor or a sensor for measuring a vital sign of an occupant such as a heart rate measurement.

When this type of electrode is sheathed on a motor vehicle steering wheel, the electrode is generally on the surface and flexible so as to be able to fit to the shape of the part on which it is positioned. The connection of this type of flexible electrode with the rest of the vehicle's electrical network is not always easy. The device and in particular the clip allows a quick and easy electrical connection of a flexible surface element by pressure.

Advantageously, the first part and the second part of the electrical circuit are heating resistors.

Advantageously, the second electrical circuit part is an electrode of a presence sensor or an element for electrical connection of the first electrical circuit part to the vehicle's electrical network.

Advantageously, the interface zone is arranged to deform the clip when the insert is in a mounted position on the vehicle component, so as to improve a contact resistance between the clip and the first and second electrical circuit parts.

The clip is defined to make the best use of its mechanical characteristics. It comprises shapes that are deformable by the interface zone which make it possible to guarantee a sturdy electrical connection between the clip and the electrical circuit parts.

Advantageously, the fastening clip comprises a connection zone such as a connection tab or lug connected to the second electrical circuit part.

This embodiment makes it possible to use the clip connecting the first and second electrical circuit parts, such as electrode parts, to a vehicle electrical network via a simple interface. This avoids, for example, soldering or brazing a wire directly onto one of the parts of the electrode, which is more cumbersome and complicated to execute.

Advantageously, the fastening clip comprises a connection zone such as a connection tab or lug connected to a vehicle electrical network.

The clip makes it possible to establish an electrical connection between a first electrical circuit part having any shape and a second wire-like circuit part via the connection tab or lug. In other words, the clip makes it possible to connect a first electrical circuit part having any shape to an electrical network of the vehicle quickly and easily.

Advantageously, the electrical device comprises a third electrical circuit part, the clip being electrically connected to the three electrical circuit parts.

Advantageously, the insert comprises an electrically conductive contact surface which can be touched by the occupant of the vehicle.

The clip makes it possible to establish a quick and easy electrical connection between an electrode inserted into a steering wheel and which can be touched by an occupant. This is particularly useful for taking a measurement of a vital sign of the occupant for which physical contact between the occupant and the electrode is necessary.

Advantageously, the electrically conductive surface of the insert forms the first electrical circuit part.

Advantageously, the first or second electrical circuit part is sandwiched between the insert and the fastening clip or between the fastening clip and a portion of the vehicle component, such as a steering wheel rim.

When the first or the second electrical circuit part is sandwiched between the fastening clip and a portion of the vehicle component, such as a steering wheel rim, the clip makes it possible to hold the first or the second electrical circuit part during mounting, before inserting the insert. Installation is thus made easier since the clip can be used as a pre-holding element due to its capacity to deform elastically.

Advantageously, the portion of the vehicle component comprises a groove,
the fastening clip being arranged in the groove,
and at least one of the first or the second electrical circuit parts comprise a folded portion in the groove.

The groove makes it possible to discreetly receive the insert and makes it possible to improve the contact resistance between the clip and the first and second electrical circuit parts. Indeed, since the clip is forcibly arranged between two walls of the groove, the resulting contact forces on the electrical circuit parts are easily maximized.

Advantageously, the fastening clip is engaged with the vehicle component by adhesion, and/or by elastic fitting, and/or by male-female coupling, and/or by soldering, and/or by plastic deformation, and/or by screwing, and/or by riveting, and/or elastic force.

Advantageously, the fastening clip is engaged with the insert for attaching same to the vehicle component.

Advantageously, the fastening clip comprises an attachment zone arranged to retain the insert, in its mounted position, on the clip by means of a retaining interface arranged on the insert.

The attachment zone makes it possible to clip the insert onto the clip. This allows a simplified integration of the various components on the vehicle component. An attachment zone distinct from the contact zone allows for optimal contact resistance and insert retention.

Advantageously, the vehicle component comprises a first portion such as a steering wheel rim and a second portion such as a steering wheel spoke, the first portion of the vehicle component comprises a junction shared with the second portion of the vehicle component, the fastening clip being positioned at the shared junction.

By positioning the fastening clip at the shared junction, the integration of the electrical device into the steering wheel is optimized. Indeed, the majority of a device for connecting the electrical circuit to the vehicle's electrical network can be integrated into the spoke. Thus the rim integrates fewer devices or components, which facilitates its design, considering that the useful volume of the rim is limited. In other words, the invention relates to a steering wheel that comprises a rim, a spoke and the electrical device, with the clip positioned at the junction between the spoke and the rim.

Advantageously, the retention of the insert on the vehicle component is provided by adhesive or protrusions on the insert which are inserted into cavities formed in the portion of the control element.

Advantageously, the retaining interface is electrically insulating so as to electrically insulate the fastening clip from the contact surface.

This makes it possible to provide an insert of which a surface visible by the occupant is electrically conductive, for example by coating with chromium, without the insert having any electrical influence on the electrical circuit. The attachment zone can, for example, be overmolded with an insulating material, or not coated with a conductive material, or the coated material can have been removed.

Advantageously, the electrical device comprises:
 a first electrical circuit part with two distinct conductive layers separated by a first insulator,
 a second electrical circuit part with two distinct conductive layers separated by a second insulator,
 a first fastening clip positioned in permanent electrical contact between a first layer of the layers of the first electrical circuit part and a first layer of the layers of the second electrical circuit part,
 and a second fastening clip positioned in permanent electrical contact between a second layer of the layers of the first electrical circuit part and a second layer of the layers of the second electrical circuit part.

Each clip connects specific layers together, which makes it possible to uncouple and physically separate the connection zones for greater design flexibility and ease of manufacturing.

Advantageously:
 the first layer of the first and second electrical circuit parts is a detection layer,
 the second layer of the first and second electrical circuit parts is a protection layer,
 the first and the second layer of the first electrical circuit part form a first capacitive sensor,
 the first and the second layer of the second electrical circuit part form a second capacitive sensor,
 and wherein the first clip connects the first layer of the first sensor with the first layer of the second sensor, the second clip connects the second layer of the first sensor with the second layer of the second sensor.

In other words, the clips make it possible to connect two capacitive sensors in series by means of two clips connecting each of the layers of the sensors two-by-two. This makes it possible to be able to define two sensors with shapes that are simple and thus less expensive instead of a single one having specific shapes for allowing the positioning of the insert.

Advantageously:
 the first layer of the first and second electrical circuit parts is arranged between the occupant of the vehicle and the second layer of the first and second electrical circuit parts,
 the second clip is sandwiched between the insert and the second layer of the first or of the second electrical circuit part.

In other words, in the contact zone between the second clip and the protection layer, there is no detection layer. This can be carried out by design during the definition of a contour of the detection layer or else the detection layer may have been removed before positioning the clip.

Advantageously, the first or the second electrical circuit part comprises a protrusion at the contact zones, the protrusion being free of the detection layer.

This makes it possible to position or shift the clip in a favorable zone of the vehicle component, namely where there is space for implanting it and not in a zone where one of the electrical circuit parts must be placed. In the case of capacitive sensors, the clips can be positioned outside the sensor measurement zones.

The vehicle component advantageously is a steering wheel.

A second aspect of the invention relates to a motor vehicle comprising an electrical device according to the first aspect of the invention.

Another aspect of the invention relates to a method for assembling the vehicle component according to the first aspect, the method comprising steps of:
 fastening at least one fastening clip to the vehicle component,
 fastening an insert to the vehicle component,
wherein the fastening of the clip and/or of the insert comprises a step consisting of electrically connecting the fastening clip with the first and second electrical circuit parts, and wherein the contact resistance between the clip and at least one of the first or the second electrical circuit part is improved during the mounting of the insert, by compression of at least one of the contact zones of the first and second electrical circuit parts.

In other words, during the mounting of the insert on the steering wheel, the contact zones, located for example between the vehicle component and the insert, are sandwiched so that the electrical contact is improved and guaranteed. The step of mounting the insert consists of placing it by force, in order to create a compression force on the contact zones.

Prior to this step of placement by force, there advantageously is a step of pre-positioning or docking the insert, without force, carried out by interlocking or partial engagement, with positive clearance between the insert and the vehicle component.

Other features and benefits of the present invention will be seen more clearly from reading the following detailed description of three embodiments of the invention, provided by way of non-limiting examples and illustrated by the appended drawings, wherein:

FIG. 3 shows a sectional view of a first embodiment

Figure 1:
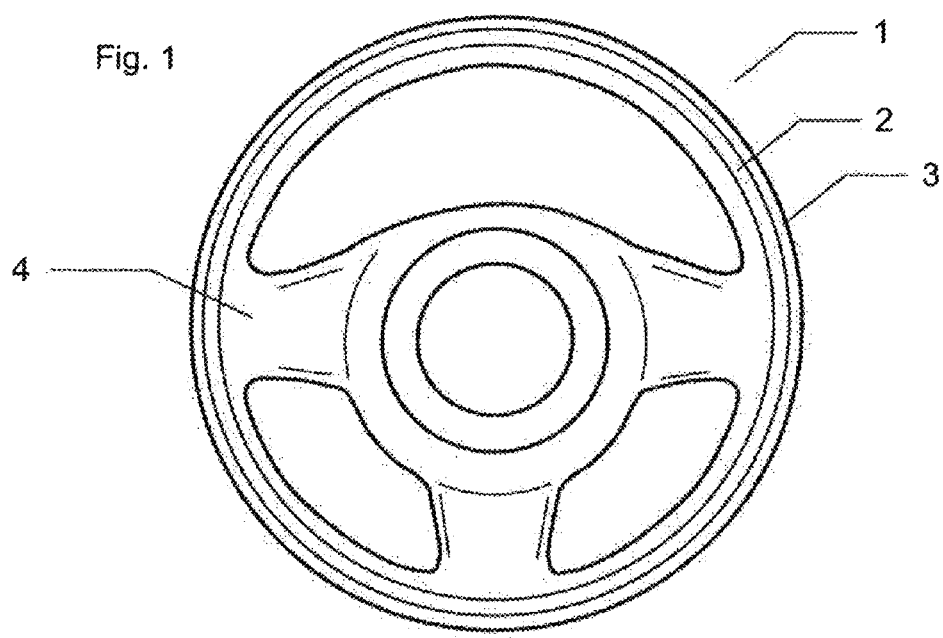
FIG. 1 shows the front view of a vehicle steering wheel comprising an electrical device according to the invention.

FIG. 1 shows a vehicle steering wheel 1 comprising a rim 3 and a spoke 4. The rim 3 is covered with a sheathing such as leather which can be formed of one or several pieces. An electrical device according to a first embodiment is integrated into the rim 3, under the sheathing. The insert 2, which is also positioned in the rim 3, is visible by the occupant. The insert 2 can be in one or several parts and can comprise one or more distinct contact surfaces that can be touched by the occupant.

Figure 2:
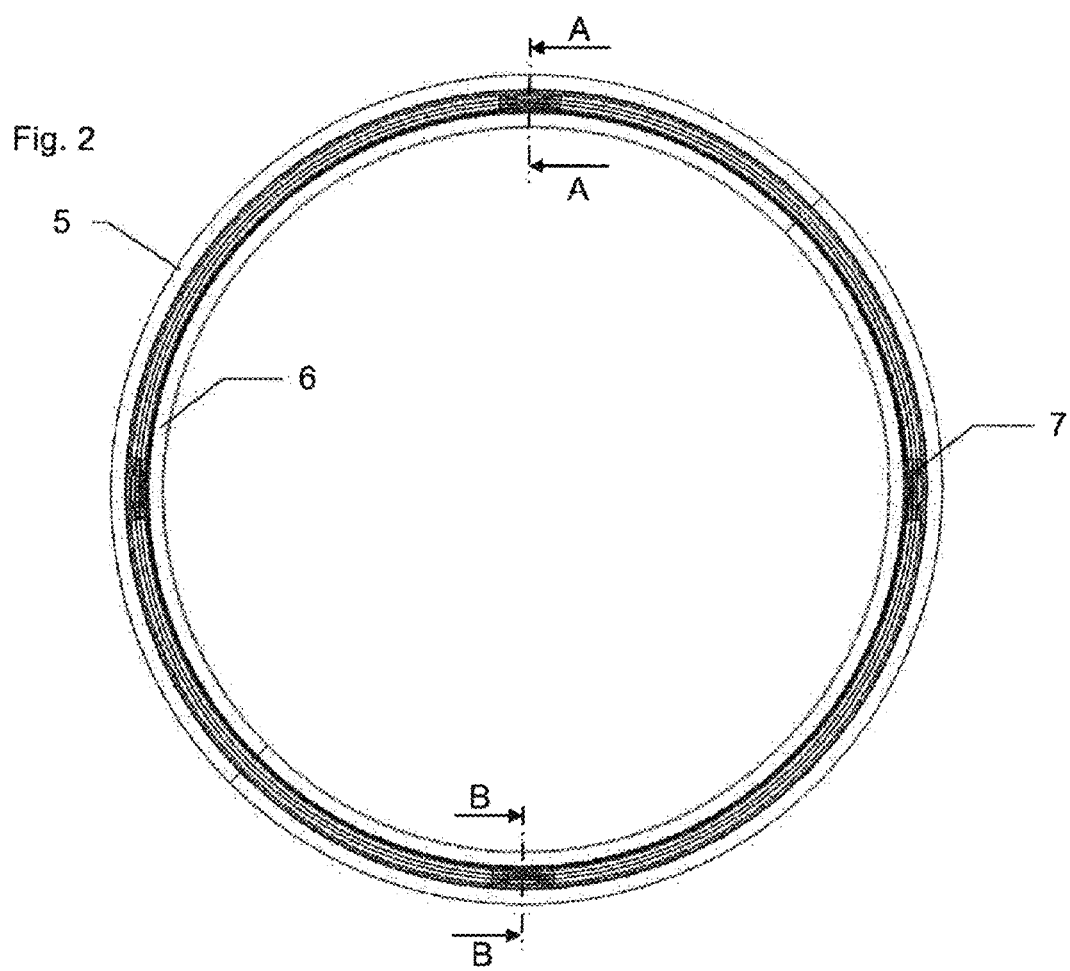
FIG. 2 shows the detail view of the rim of the vehicle steering wheel of FIG. 1

FIG. 2 shows details of the rim 3 of the steering wheel of FIG. 1. The spoke 3, the sheathing and the insert 2 are not shown. Four fastening clips 7 are regularly positioned along the rim, including three at the spokes visible in FIG. 1.

FIG. 3 shows a detail view according to section A-A shown in FIG. 2. The rim 3 is made up of a framework 34 surrounded by foam 36 in which a groove 35 is formed. A first electrical device part 5 such as a sensor and a second electrical device part 6 are sheathed on the foam. This embodiment can implement heating elements instead of sensors as electrical circuit parts.

The first and second parts 5, 6 comprise contact zones 51, 61 which are formed by protrusions that protrude into the groove 35 and thus form folded portions.

A fastening clip 7 of which two ends 71, 72 are in electrical contact with the contact zones 51, 61 of the first and second electrical device parts 5, 6 is arranged in the groove 35.

The first and second electrical device parts 5, 6 are covered by two sheathing parts 31, 32 which are connected by a seam 33. One end of each sheathing part 31, 32 is tucked into the groove 35 and partially covers the two clip ends 71, 72.

An insert 2 visible by the occupant completes the assembly by being also positioned in the groove 35. The insert comprises an interface zone 21 in the form of a ridge which presses the ends 71, 72 of the clip 7 onto the contact zones 51, 61 via the sheathing parts 31, 32. To further improve the electrical contact, the ridge 21 can come into direct contact with the fastening clip 7. To increase the retention of the insert 2 in the groove, the insert 2 comprises a retaining interface 22 in the form of a shoulder which is clipped into an attachment zone 73 of the clip 7, formed by a flexible strip.

Figure 4A:
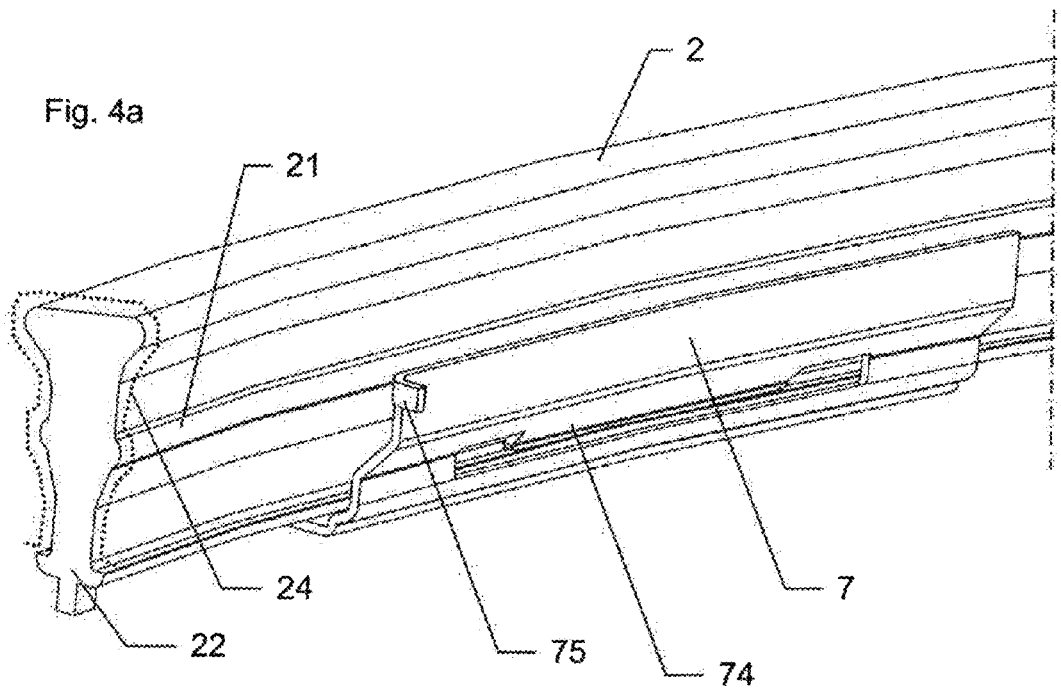
FIG. 4a shows a detail view of a second embodiment

FIG. 4a shows a second embodiment. For greater clarity, a single fastening clip 7 and a piece of the insert 2 are shown in an isometric view. In this embodiment, the first electrical circuit part 5 is the insert 2 which comprises a contact surface 24 that can be touched by the occupant and is at least partially conductive, either because the insert is made of an electrically conductive material, or because the contact surface is entirely or partially covered with an electrically conductive coating such as chromium. This contact surface 24 is electrically connected to the retaining interface 22 which comes into contact with the fastening lamella 74 of the clip 7. The clip also comprises a tab 75 which allows the clip to be connected by a lug to the second electrical circuit part, not shown, which is a part of an electrical network of the vehicle. Alternatively, instead of a tab, a lug could be created on the clip in order to establish the electrical connection. Since the clip is formed of an electrically conductive material such as steel, the contact surface 24 of the insert is in electrical contact with the tab 75 of the clip when the insert is in the mounted position thereof. The contact resistance is improved during mounting due to the flexibility of the lamella 74. Thus, the insert 2 can be used as an electrode for measuring heart rate for example, which is connected very easily to the vehicle's electrical network. The fastening clip 7 makes it possible to simultaneously retain the insert 2 on the rim 3 while connecting it electrically to the vehicle's electrical network.

The clip 7 is advantageously located on the rim 3 facing the spoke 4 which makes it possible to connect the clip 7 even more easily to the vehicle network. Indeed, no cable needs to be run through the rim 3, which is an element with limited volume where every space saving is useful.

Figure 4B:
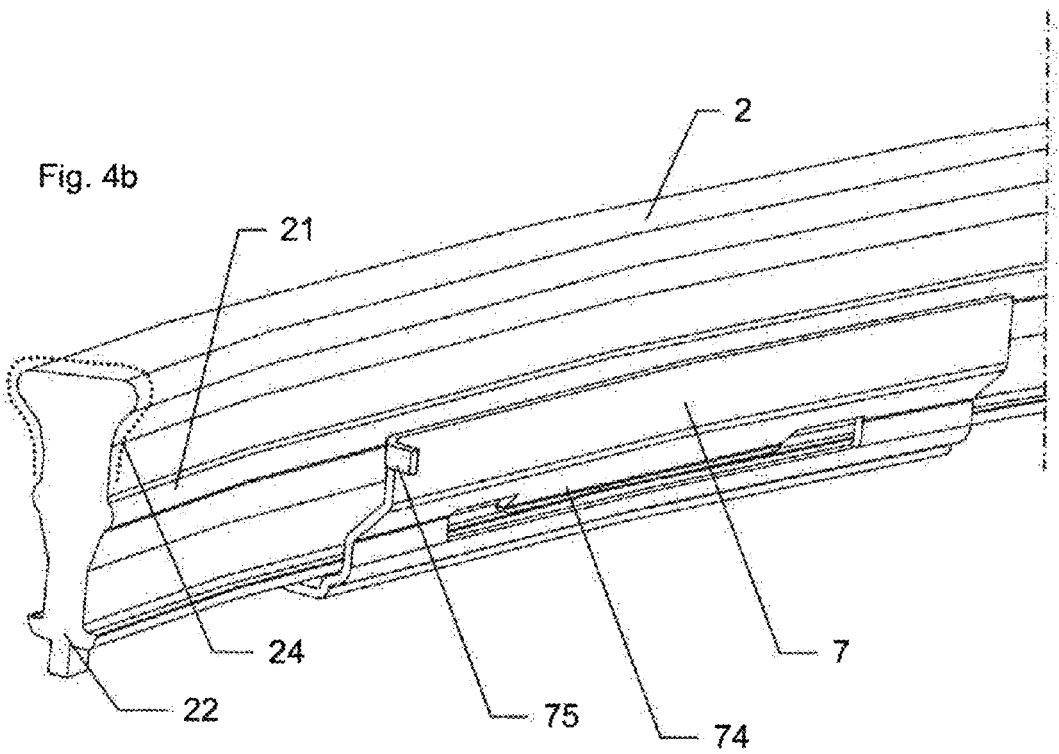
FIG. 4b shows a detail view of a combination of the first and second embodiments

FIG. 4b shows a combination of the first and second embodiments. In this embodiment, the first and second electrical circuit parts are the same as for the first embodiment and are not shown. The conductive contact surface 24 of the insert is not electrically connected to the retaining interface 22 so that the contact surface 24 is not part of the electrical circuit as in the second embodiment. However, the tab 75 can be used to electrically connect the first and second electrical circuit parts to the vehicle's electrical network. Since the first and second electrical circuit parts are flexible electrodes intended for being sheathed on the rim 3, the clip 7 and its tab 75 make it possible to avoid complicated electrical connections on the flexible electrodes.

It is possible to provide, on the steering wheel, a clip according to the first embodiment for connecting two circuit parts placed under the sheath, and a second clip according to the second embodiment for connecting an outer surface of the insert to an electrical conductor.

Figure 5A:
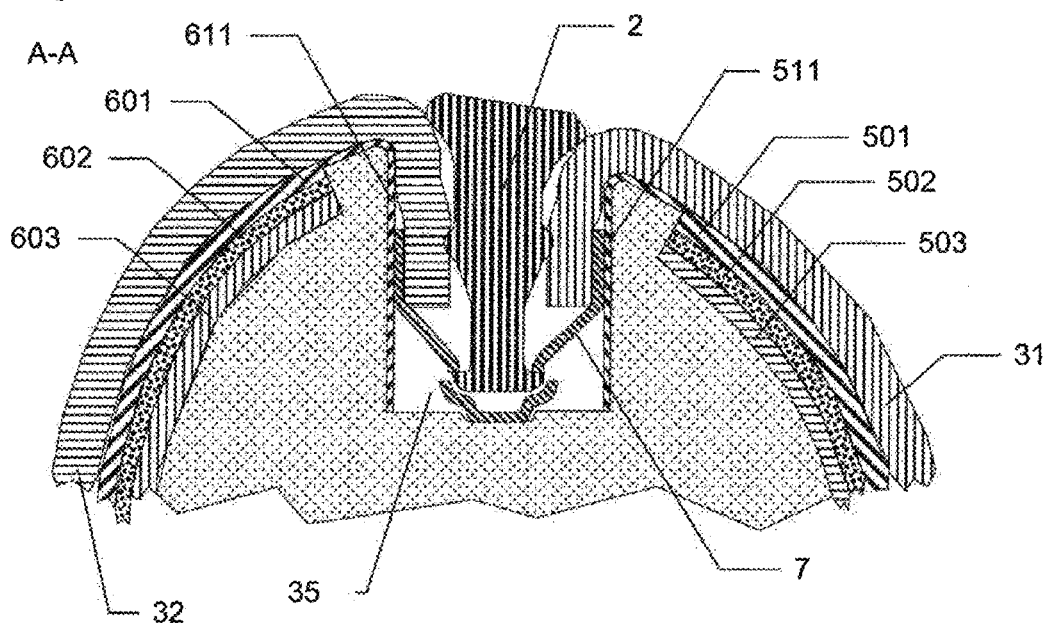
FIG. 5a shows a view according to a first section of a third embodiment.
Figure 5B:
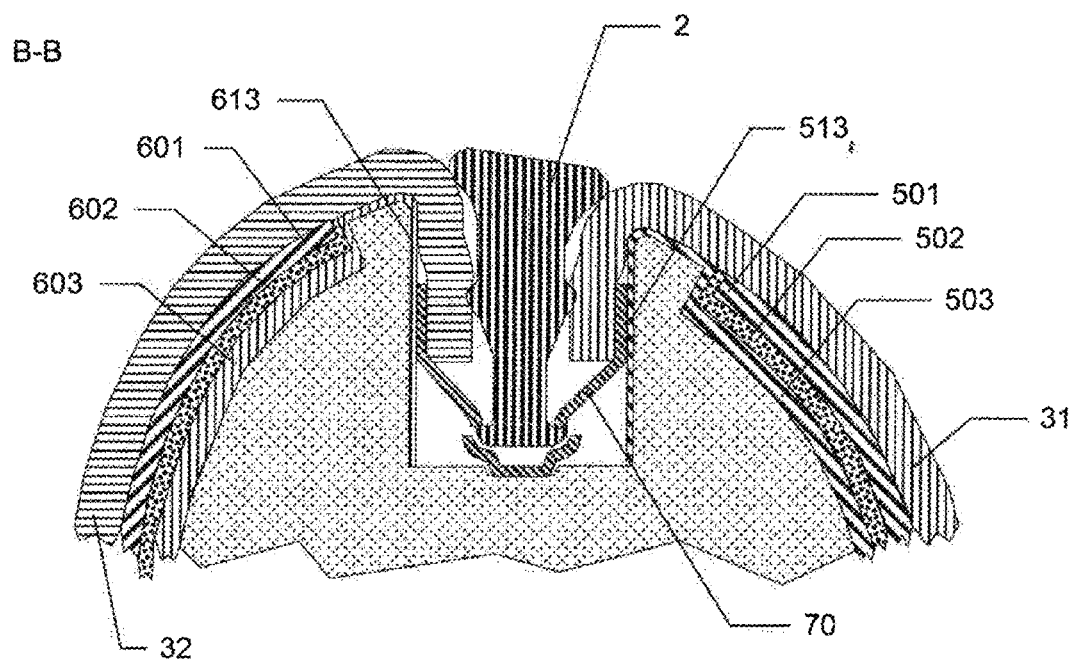
FIG. 5b shows a view according to a second section of a third embodiment

FIGS. 5a and 5b show a third embodiment which is an improvement of the first embodiment. The common elements will not be discussed again. In this embodiment, the electrical device comprises two clips electrically connected in different ways to one another and positioned at two different locations on the steering wheel.

FIG. 5a shows a detail view according to section A-A shown in FIG. 2. The first electrical device part 5 is made up of a first conductive detection layer 501 and a second conductive protection layer 503 between which a first insulating layer 502 is located. These three layers thus form a first capacitive sensor. The second electrical device part 6 is made up of a first conductive detection layer 601 and a second conductive protection layer 603 between which a second insulating layer 602 is located. These three layers thus form a second capacitive sensor. Only the first conductive detection layers 501, 601 comprise contact zones 511 and 611 protruding into the groove 35 so that the clip 7 only connects together the two detection layers 501 and 601 of the two sensors. The contact zones 511 and 611 can be formed from conductive elements that are larger than those of the protection layers or else parts of the protection layers can have been removed from sensors that were initially identical on all their faces.

FIG. 5b shows a detail view according to section B-B shown in FIG. 2. In this zone, the second clip 70 only connects together the two protection layers 503, 603 of the two sensors. Indeed, only the second conductive protection layers 503, 603 comprise contact zones 513 and 613 protruding into the groove 35.

It will be understood that various modifications and/or improvements obvious to those skilled in the art can be made to the different embodiments of the invention described in the present description, without going beyond the scope of the invention as defined by the appended claims.

The invention claimed is:

1. An electrical device for a motor vehicle component, comprising:
a first electrical circuit part of the electrical device,
a second electrical circuit part of the electrical device,
an insert at least partially visible by an occupant of the vehicle, wherein the insert comprises an electrically conductive contact surface which can be touched by the occupant of the vehicle, and wherein the electrically conductive contact surface of the insert forms the first electrical circuit part, characterized:
in that the device comprises a flexible fastening clip in permanent electrical contact with the first electrical circuit part and the second electrical circuit part,
and in that the insert comprises a zone that interfaces with the fastening clip, the fastening clip being arranged, when the insert is in a mounted position on the motor vehicle component, to compress at least one contact zone of the first electrical circuit part and the second electrical circuit part so as to resiliently improve a contact resistance between the fastening clip and at least one of the first electrical circuit part and the second electrical circuit part.

2. The electrical device according to the claim 1, wherein the interface zone is arranged to deform the fastening clip when the insert is in a mounted position on the motor vehicle component, so as to improve the contact resistance between the fastening clip, the first electrical circuit part, and the second electrical circuit part.

3. The electrical device according to claim 1, wherein the fastening clip comprises a connection zone connected to the second electrical circuit part.

4. The electrical device according to claim 1, wherein the fastening clip comprises an attachment zone arranged in order to retain the insert, in the mounted position thereof, on the fastening clip by means of a retaining interface arranged on the insert.

5. The electrical device according to claim 4,
wherein the insert comprises an electrically conductive contact surface which can be touched by the occupant of the vehicle, and
wherein the retaining interface is electrically insulating so as to electrically insulate the fastening clip from the contact surface.

6. The electrical device according to claim 1, mounted on a motor vehicle.

7. An electrical device for a motor vehicle component, comprising:
a first electrical circuit part of the electrical device,
a second electrical circuit part of the electrical device,
an insert at least partially visible by an occupant of the vehicle, characterized:
in that the device comprises a flexible fastening clip in permanent electrical contact with the first electrical circuit part and the second electrical circuit part, and in that the insert comprises a zone that interfaces with the fastening clip, the interface zone being arranged, when the insert is in a mounted position on the motor vehicle component, to compress at least one contact zone of the first electrical circuit part and the second electrical circuit part so as to resiliently improve a contact resistance between the fastening clip and at least one of the first part or second part of the electrical circuit, and wherein
the first electrical circuit part comprises two distinct conductive layers separated by a first insulator,
the second electrical circuit part comprises two distinct conductive layers separated by a second insulator,
the fastening clip is positioned in permanent electrical contact between a first layer of the layers of the first electrical circuit part and a first layer of the layers of the second electrical circuit part,
and further comprising a second fastening clip positioned in permanent electrical contact between a second layer of the layers of the first electrical circuit part and a second layer of the layers of the second electrical circuit part.

8. The electrical device according to claim 7, wherein:
the first layer of the first electrical circuit part and the second electrical circuit part is a detection layer,
the second layer of the first electrical circuit part and the second electrical circuit part is a protection layer,
the first layer and the second layer of the first electrical circuit part form a first capacitive sensor,
the first layer and the second layer of the second electrical circuit part form a second capacitive sensor,
and wherein the first fastening clip connects the first layer of the first sensor with the first layer of the second sensor, the second fastening clip connects the second layer of the first sensor with the second layer of the second sensor.

9. The electrical device according to claim 8, wherein
the first layer of the first electrical circuit part and the second electrical circuit part is arranged between the occupant of the vehicle and the second layer of the first electrical circuit part and the second electrical circuit part,
the second fastening clip is sandwiched between the insert and the second layer of the first electrical circuit part or the second electrical circuit part.

* * * * *